United States Patent [19]

Dean

[11] 4,429,348
[45] Jan. 31, 1984

[54] PRINTED CIRCUIT MOUNTING APPARATUS ESPECIALLY FOR USE IN LUMINAIRES

[75] Inventor: John R. Dean, Memphis, Tenn.

[73] Assignee: International Telephone and Telegraph Corporation, New York, N.Y.

[21] Appl. No.: 340,512

[22] Filed: Jan. 18, 1982

[51] Int. Cl.³ ............................................. H05K 1/18
[52] U.S. Cl. ..................................... 361/399; 24/106; 174/68.5; 361/418; 361/419; 428/100
[58] Field of Search ............... 361/399, 417, 418, 419, 361/420, 421; 428/100; 24/306; 128/DIG. 15

[56] References Cited

U.S. PATENT DOCUMENTS

| | | | |
|---|---|---|---|
| 3,499,102 | 3/1970 | Gillemot | 174/138 F |
| 3,601,917 | 8/1971 | Shankman | 428/100 X |
| 3,721,050 | 3/1973 | Perina | 428/100 X |
| 4,317,154 | 2/1982 | Passarella | 361/399 X |

OTHER PUBLICATIONS

Ray Hill, Dozens of Uses of Versatile Velcro Fasteners, Popular Science, Jul. 1978, pp. 101 to 112.

Primary Examiner—R. R. Kucia
Attorney, Agent, or Firm—James B. Raden; Marvin M. Chaban

[57] ABSTRACT

Apparatus for mounting a printed circuit board to a conductive surface in a manner to allow removal of the board from the surface without requiring the use of any tools. The mounting is performed by an insulating layer covering the printed circuit board interposed between the board and the conductive surface. The insulation exhibits high temperature stability. Preferably the mounting uses hook and pile strips of nylon with one strip adhered to and covering the entire board and one or more mating strips adhered to the conductive surface.

4 Claims, 4 Drawing Figures

PRINTED CIRCUIT MOUNTING APPARATUS ESPECIALLY FOR USE IN LUMINAIRES

BACKGROUND OF THE INVENTION

In the outdoor luminaire art, especially that using high pressure gas discharge lamps, there are a number of requirements for mounting the printed circuit board containing the starting circuit components. The circuit board must mount to a metal surface and its mounting must withstand 2500 volt pulses. Good engineering practice requires that the mounting must provide insulation capable of withstanding 5000 volts steadily. The board must be removable for replacement using no tools other than a screwdriver, the mounting must withstand a temperature of 90° C. and must meet vibration test specifications with the board mounted on a vertical wall.

In the normal procedure, the printed circuit board is screwed, bolted, or clipped to a mounting means insulated by suitable insulating material from the metal conductive luminaire wall.

SUMMARY OF THE INVENTION

The present invention is directed to apparatus for mounting a printed circuit board directly on a conductive metallic surface in a manner allowing ready removal and replacement. The mounting provides insulation between the circuit and the mounting surface. The insulation is capable of withstanding up to 5000 volts and withstanding temperatures of 105° C. The mounting apparatus is preferably by hook and pile or hook and loop fastening strips, the strip mounted to the board covering the entire board. The strips may be adhered to the board and mounting surface through the use of adhesives or by the use of double sided tape. The preferable material for the hook and pile material is a nylon of the type readily available as an off-the-shelf item.

It is therefore an object of the invention to provide an improved insulating fastener for affixing a printed circuit board to a conductive surface in a manner allowing ready removal of the board from the surface where desired, and without the use of tools.

DETAILED DESCRIPTION

Figure 1:
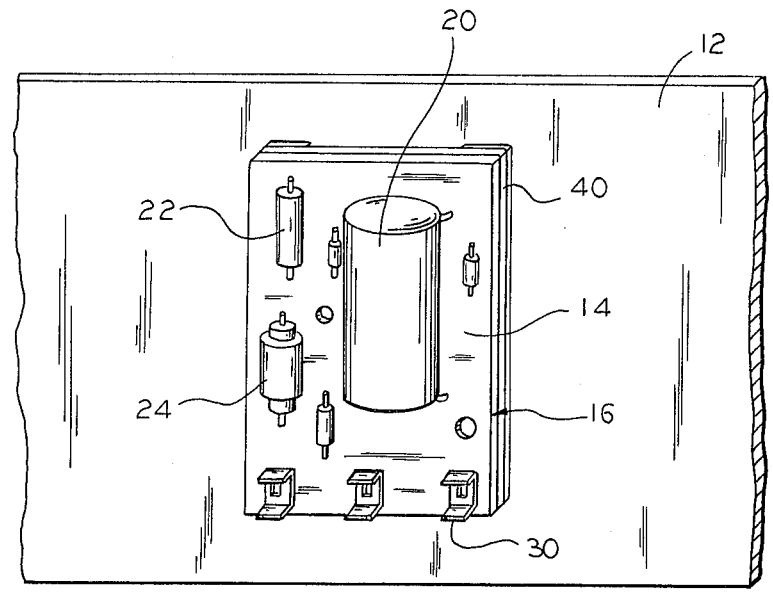
FIG. 1 is a perspective view of a printed circuit board mounted to a wall using the present invention.
Figures 2, 3:
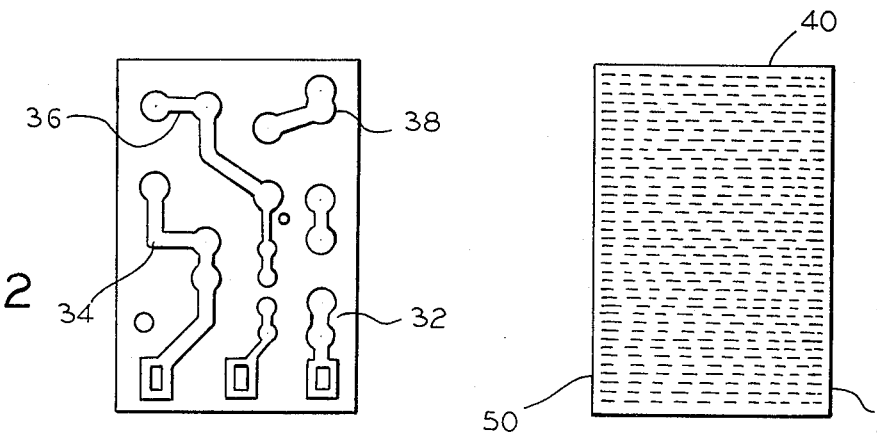
FIG. 2 is a rear view in elevation of the board of FIG. 1 showing the conductive paths thereon.
FIG. 3 is a front view of the mounting strip used in FIG. 1.

In FIG. 1, I show a section of a wall 12 which preferably is the interior surface of the metal housing of an outdoor luminaire such as that shown by U.S. Pat. No. 3,353,015 issued Nov. 14, 1967 to J. Franklin et al. In such luminaire structures and in ones of more recent vintage, electric and electronic control circuits are mounted within the luminaire housing. The mounting must meet safety and operating standards as far as insulation and temperature requirements. Ease of removal and replacement standards are frequently specified by customers of such luminaires.

Where discrete electronic components are used, current practice calls for mounting the components on one face, the front face, of a printed circuit board. As is customary, the leads from the components extend through openings in the board for connection to printed conductive paths on the rear side of the board. At one end of the board are mounted connector terminals suitably riveted or soldered to the conductive paths or printed circuits on the rear side of the board. Such a board is shown in FIGS. 1 and 2. In FIG. 1, I show the front face 14 of a printed circuit board 16 to which electrical or electronic discrete components 20, 22 and 24 are mounted. Terminals 30 are secured on the front face also riveted or staked to the rear surface 32 (FIG. 2) of the board 16.

On the rear surface 32 (FIG. 2), are the printed circuits or conductive paths 34, 36, 38 etc. to which the components and terminals are connected, as desired.

The printed circuit board described to this point is conventional and for the use disclosed may be approximately $1\frac{7}{8}''$ wide by $2\frac{3}{4}''$ long to comprise the starting circuit of a luminaire such as that of a high pressure sodium luminaire.

To mount such a board to the metal wall of the luminaire, many mounting approaches and structures have been used in the past. The most conventional approach in mounting of printed circuit boards is installing two spaced apart slide guides for receiving the lateral edges of the board, the slides spacing the back of the board from the mounting wall. Plug-in edge connectors on the mounting structure mate with edge terminals on the board to connect the board to a power source and to the load.

In another form, the back of the board is covered with suitable insulating material and by the use of suitable clips the board is held in position inside of the luminaire.

In FIG. 1, the printed circuit board 16 is mounted on the wall 12 through the use of hook and loop fastening materials such as those sold under the trademark Velcro. As is known, such fastening materials include two sheets of plastic material with mating faces, one having plural loops or pile and the other plural hooks. When the mating faces are forced together, the sheets fasten together tightly.

In the preferred form, the hook sheet 40 shown in FIG. 3 would be affixed to the back face of the PC board, the sheet preferably being of nylon with the hook face of the sheet being away from the PC board. The sheet would be of a size such as shown in FIG. 2 sufficiently great to cover the entire rear face 32 of the board and clearly all portions having the conductive circuit path. The sheet would be adhered to the board by means of suitable liquid adhesive, by the use of two sided tape strips of known type, or by mechanical fastening means.

Figure 4:
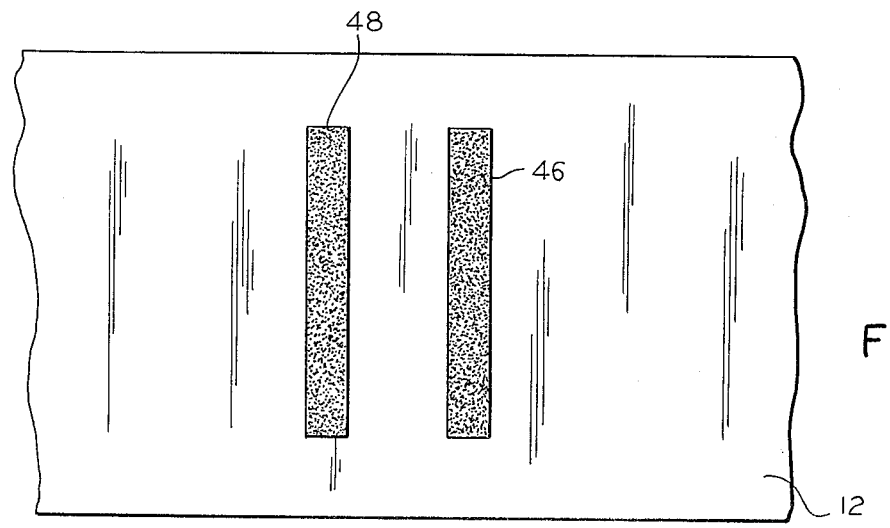
FIG. 4 is a side view in elevation of the wall of FIG. 1 with one set of mounting strips adhered thereto.

Secured to the metal wall 12 of the housing would be the loop or pile section of the fastening. Shown in FIG. 4 are two strips 46 and 48 of the loop or pile fastener material adhered or mechanically fastened to the wall 12. The strips are spaced apart to mate with the sheet 40 adjacent both lateral edges 50 of the sheet. The strips 46 and 48 would be in board of the edge 50 to enable gripping of the sheet manually for removal.

At present, only the hook and loop material is available in nylon or other material sufficient to provide insulating characteristics to withstand 5,000 volts, to meet temperature requirements of about 105° C. constant operating temperature.

Other fasteners use mushroom-like members on both mating sheets to provide a similar fastening capability. At the present time such fastening systems called Dual Lock are fabricated of polyolefins which do not meet temperature specifications as required. If however, provided such fasteners are fabricated of nylon, or other suitable materials, the temperature requirements for use in luminaires could be met. Insulating characteristics and holding characteristics could also be met. Such devices then could be substituted for the hook and loop type fastening shown herein.

Either type of fastener has been found to meet vibration specifications, insulating charcteristics specifications and holding requirements. Fastening systems using nylon or the like have been found to meet the temperature requirements.

What is claimed is:

1. Apparatus for demountably fastening a printed circuit board to the surface of an electrically conductive interior metal wall of an outdoor luminaire in which said board contains a control circuit comprising discrete electrical components on one face thereof and electrically conductive circuits interconnecting the components on the opposite face thereof, said apparatus including a first and a second complementary mating hook and pile fastening strip of electrically insulating material such as nylon, at least one of said strips having a face of sufficient area to cover and electrically insulate the conductive circuits on the board, means affixing the first of said strips to the opposite face of the board to position the mating face of the strip away from the board, means affixing the second strip to the surface with the mating face of the second strip positioned away from the surface whereby to interpose a layer of electrically insulating material between the board and said surface when the mating faces of the strips are mated together.

2. Apparatus as claimed in claim 1, in which said layer of insulating material will withstand pulses of up to 2500 volts and will maintain its insulating characteristics and mating fastening to 105° C. temperature.

3. Apparatus as claimed in claim 1, in which both said affixing means comprise two face adhesive strips with adhesive material on both opposing faces thereof.

4. Apparatus for demountably fastening a printed circuit board to an electrically conductive metal wall surface in which said board contains discrete electrical components on one face thereof and electrically conductive circuits interconnecting the components on the opposite face thereof, said apparatus including a first and a second complementary mating hook and pile fastening strips of electrically insulating material such as nylon, at least one of said strips having a face of sufficient area to cover and electrically insulate the conductive circuits on the board, means affixing the first of said strips to the opposite face of the board to position the mating face of the strip away from the board, means affixing the second strip to the wall with the mating face of the second strip positioned away from the wall whereby to interpose a layer of electrically insulating material adapted to withstand high voltages and temperatures between the board and said metal wall when the mating faces of the strips are mated together.

* * * * *